US009576722B2

(12) United States Patent
Watanabe et al.

(10) Patent No.: US 9,576,722 B2
(45) Date of Patent: Feb. 21, 2017

(54) ELECTRONIC COMPONENT AND MANUFACTURING METHOD THEREOF

(71) Applicant: TDK Corporation, Tokyo (JP)

(72) Inventors: Fumio Watanabe, Tokyo (JP); Naozumi Ishikawa, Tokyo (JP); Hiroshi Kamiyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 31 days.

(21) Appl. No.: 14/227,111

(22) Filed: Mar. 27, 2014

(65) Prior Publication Data

US 2014/0292466 A1 Oct. 2, 2014

(30) Foreign Application Priority Data

Mar. 28, 2013 (JP) ................................. 2013-069165

(51) Int. Cl.

| | |
|---|---|
| ***H01F 27/29*** | (2006.01) |
| ***H01L 27/08*** | (2006.01) |
| ***H01L 21/20*** | (2006.01) |
| ***H01F 17/00*** | (2006.01) |
| ***H01F 41/04*** | (2006.01) |
| *C25D 5/02* | (2006.01) |

(52) U.S. Cl.

CPC .......... *H01F 27/29* (2013.01); *H01F 17/0013* (2013.01); *H01F 41/042* (2013.01); *C25D 5/022* (2013.01); *H01F 2017/0066* (2013.01)

(58) Field of Classification Search

CPC H01F 17/0013; H01F 27/292; H01F 27/2804; H01F 2017/0093; H01F 27/29; H01F 17/0006; H01F 2027/2809

USPC ......... 336/192, 200; 257/531; 438/381, 259, 438/573

See application file for complete search history.

(56) References Cited

U.S. PATENT DOCUMENTS 4,889,777 A * 12/1989 Akuto ............... H01M 10/0436 29/623.4
5,196,377 A * 3/1993 Wagner ............... H01L 21/4803 257/E23.008
5,583,381 A * 12/1996 Hara ..................... H01L 23/291 257/207
5,652,157 A * 7/1997 Hirano .............. H01L 21/28581 257/E21.173

(Continued)

FOREIGN PATENT DOCUMENTS

CN 1929050 A 3/2007
CN 101246894 A 8/2008

(Continued)

*Primary Examiner* — Elvin G Enad
*Assistant Examiner* — Joselito Baisa
(74) *Attorney, Agent, or Firm* — Young Law Firm, P.C.

(57) ABSTRACT

A coil component 1 includes a thin-film coil layer including spiral conductors and bump electrodes 12*a* to 12*d* formed on a surface of the thin-film coil layer. The thin-film coil layer includes internal terminal electrodes 24*a* to 24*d* connected respectively to corresponding one ends of the spiral conductors, and a fourth insulating layer 15*d* covering the internal terminal electrode 24*a* to 24*d* and having openings ha to hd. Both a top surface TS and a side surface SS of each of the internal terminal electrodes 24*a* to 24*d* are exposed through the corresponding opening. The bump electrodes 12*a* to 12*d* are each brought into contact with both the top surface TS and side surface SS of each of the internal terminal electrodes 24*a* to 24*d* in the corresponding opening.

12 Claims, 9 Drawing Sheets

(56) References Cited

U.S. PATENT DOCUMENTS

| | | | | |
|---|---|---|---|---|
| 6,291,897 | B1 * | 9/2001 | Wark | G01R 1/06738 257/449 |
| 6,400,027 | B1 * | 6/2002 | Takahashi | H01L 23/5222 257/522 |
| 6,831,528 | B2 * | 12/2004 | Nagata et al. | 333/101 |
| 7,109,583 | B2 * | 9/2006 | Johnson | H01L 23/49811 257/734 |
| 7,161,250 | B2 * | 1/2007 | Wark | G01R 1/06738 257/779 |
| 7,205,661 | B2 * | 4/2007 | Wark | G01R 1/06738 257/737 |
| 7,335,951 | B2 * | 2/2008 | Nishi | H01L 27/1446 257/350 |
| 7,696,849 | B2 * | 4/2010 | Ito et al. | 336/192 |
| 8,050,045 | B2 * | 11/2011 | Okuzawa | H01F 27/292 29/830 |
| 8,174,349 | B2 * | 5/2012 | Yoshida et al. | 336/200 |
| 8,207,589 | B2 * | 6/2012 | Kusumoto | H01L 31/147 257/233 |
| 8,304,905 | B2 * | 11/2012 | Matsui | H01L 23/3192 257/737 |
| 2001/0026017 | A1 | 10/2001 | Seto | |
| 2003/0076211 | A1 * | 4/2003 | Matsuta | H01F 17/0013 336/200 |
| 2005/0130413 | A1 * | 6/2005 | Shimoto | H01L 21/4857 438/637 |
| 2006/0170113 | A1 * | 8/2006 | Tanaka | H01L 23/13 257/778 |
| 2006/0220230 | A1 * | 10/2006 | Tanaka | H01L 23/481 257/723 |
| 2007/0040163 | A1 * | 2/2007 | Okuzawa | H01F 27/292 257/31 |
| 2007/0080447 | A1 * | 4/2007 | Hasebe | H01L 23/142 257/706 |
| 2008/0108205 | A1 * | 5/2008 | Nishi | H01L 27/1446 438/463 |
| 2008/0203515 | A1 | 8/2008 | Kusumoto et al. | |
| 2010/0157565 | A1 | 6/2010 | Yoshida | |
| 2012/0133472 | A1 | 5/2012 | Nishikawa | |
| 2012/0319811 | A1 * | 12/2012 | Chu | 336/200 |
| 2013/0200977 | A1 | 8/2013 | Miyazaki et al. | |
| 2014/0266547 | A1 | 9/2014 | Watanabe et al. | |

FOREIGN PATENT DOCUMENTS

| | | | |
|---|---|---|---|
| CN | 104051125 | A | 9/2014 |
| JP | H09-270325 | | 10/1997 |
| JP | H11-251148 | | 9/1999 |
| JP | 2011-014747 | | 1/2011 |
| JP | 2011-71457 | A | 4/2011 |
| JP | 2012-114363 | A | 6/2012 |
| KR | 20120113282 | | 10/2012 |

* cited by examiner

ELECTRONIC COMPONENT AND MANUFACTURING METHOD THEREOF

BACKGROUND OF THE INVENTION

Field of the Invention

The present invention relates to an electronic component and a manufacturing method thereof and, more particularly, to a coil component such as a common mode filter and a manufacturing method thereof.

Description of Related Art

A common mode filter, which is known as one of electronic components, is widely used as a noise suppression component for a differential transmission line. Recent progress of manufacturing technology allows the common mode filter to be realized as a very small surface mount chip component, and a coil pattern to be incorporated is significantly reduced in size and space.

Further, in a common mode filter of so-called a thin film type, there is known a common mode filter in which an external terminal electrode is increased in thickness by plating (see, e.g., Japanese Patent application Laid-open No. 2011-14747). In a common mode filter of this type, when the external terminal electrode and a planar coil pattern are connected to each other, an internal terminal electrode connected to an inner or outer peripheral end of the planar coil pattern is connected to the external terminal electrode. An insulating layer is interposed between the external and internal terminal electrodes, and the external terminal electrode is connected, in a planar fashion, to a top surface of the internal terminal electrode through an opening formed in the insulating layer.

With recent miniaturization of a chip size, an area of the internal terminal electrode has significantly been reduced. When the external terminal electrode is connected to the internal terminal electrode having such a small area, a joint strength between the internal and external terminal electrodes may be insufficient, so that an electrical connection failure can easily be caused due to thermal shock and so on. Such a problem occurs notably in the above-mentioned common mode filter; however, it occurs not only for terminal electrode connection in the common mode filter but also for terminal electrode connection in various electronic components, and a solution to this problem is desired.

SUMMARY

An object of the present invention is, therefore, to provide an electronic component capable of increasing the joint strength between the external and internal terminal electrodes and a manufacturing method thereof.

To solve the above problem, an electronic component according to an aspect of the present invention includes a conductor layer including a first terminal electrode, an insulating layer covering the conductor layer and having an opening, at least a part of a top surface and at least a part of a side surface of the first terminal electrode being positioned inside the opening, and a second terminal electrode formed on the insulating layer so as to be connected to both the top and side surfaces of the first terminal electrode through the opening.

According to the present invention, since the second terminal electrode is connected to both the top and side surfaces of the first terminal electrode, joint strength between the first and second terminal electrodes can be enhanced. Thus, an electronic component with high reliability can be provided.

In the present invention, it is preferable that the opening has an extended portion running outward over a periphery of the first terminal electrode in a plan view. In this case, the opening is preferably formed to extend up to an edge of the insulating layer. With this configuration, the opening inside which both the top and side surface of the first terminal electrode are positioned can be easily formed.

The electronic component according to the present invention preferably further includes a substrate and a thin-film coil layer formed on the substrate and having the conductor layer and the insulating layer, wherein the conductor layer further includes a planar coil pattern connected to the first terminal electrode, the first terminal electrode is an internal terminal electrode of the thin-film coil layer, and the second terminal electrode is an external terminal electrode formed on a surface of the thin-film coil layer. With this configuration, the joint strength between the external and internal terminal electrodes can be enhanced in a coil component as the electronic component, thereby increasing connection reliability between the terminal electrodes.

In the present invention, it is preferable that the internal terminal electrode has at least a first side surface parallel to a longitudinal direction (first direction) of the substrate and at least a second side surface parallel to a direction (second direction) perpendicular to the longitudinal direction, and at least one of the first and second side surfaces is positioned inside the opening. It is more preferable that both the first and second side surfaces are positioned inside the opening. With this configuration, a contact area between the first and second terminal electrodes can toe increased to thereby further increase the connection reliability.

In the present invention, it is preferable that the thin-film coil layer has a multi-layered structure in which a plurality of the conductor layers and a plurality of the insulating layers are alternately stacked, the opening is formed in an uppermost one of the insulating layers, and both the top and side surfaces of the first terminal electrode formed in an uppermost one of the conductor layers are positioned inside the opening.

In the present invention, it is preferable that the thin-film coil layer preferably has a multi-layered structure in which a plurality of the conductor layers and a plurality of the insulating layers are alternately stacked, the opening is formed in each of the insulating layers, and tooth the top and side surfaces of the first terminal electrode formed in each of the conductor layers are positioned inside the opening. With this configuration, the depth of the opening is large and, thus, the contact area between the second terminal electrode and side surface of the first terminal electrode can be increased to thereby further enhance the joint strength between the first and second terminal electrodes.

A manufacturing method of an electronic component according to the present invention includes forming a conductor layer including a first terminal electrode, forming an insulating layer covering the first terminal electrode, forming an opening in the insulating layer so that at least a part of a top surface and at least a part of a side surface of the first terminal electrode are exposed through the opening, and forming a second terminal electrode on the insulating layer so that the second terminal electrode is in contact with both the top and side surfaces of the first terminal electrode through the opening.

According to the present invention, the second terminal electrode can be connected to both the top and side surfaces of the first terminal electrode to thereby enhance joint strength between the first and second terminal electrodes. Thus, an electronic component with high reliability can be manufactured.

The manufacturing method of a electronic component preferably includes forming a thin-film coil layer including a planar coil pattern on a substrate and forming an external terminal electrode on the thin-film coil layer, wherein the forming the thin-film coil layer includes the forming the conductor layer, the insulating layer, and the opening, the first terminal electrode is an internal terminal electrode connected to the planar coil pattern, and the second terminal electrode is the external terminal electrode. According to this manufacturing method, the side surface of the internal terminal electrode can be exposed by slightly extending the opening formed in the insulating layer without a special process. This can facilitate a finishing process and enhance the joint strength between the external and internal terminal electrodes. Thus, a coil component with high reliability can be manufactured.

An electronic component according to another aspect of the present invention includes a substrate, a thin-film coil layer formed on the substrate, and an external terminal electrode formed on a top surface of the thin-film coil layer. The thin-film coil layer includes a first conductor layer including a planar coil pattern and a first internal terminal electrode, a first insulating layer covering the first conductor layer and having a first opening, at least a top surface of the first internal terminal electrode being positioned inside the opening, a second conductor layer including a second internal terminal electrode formed on the first insulating layer so that the second internal terminal electrode is connected to the top surface of the first internal terminal electrode through the first opening, and a second insulating layer covering the second conductor layer and having a second opening, both top and side surfaces of the second internal terminal electrode being positioned inside the opening. The external terminal electrode is formed on the second insulating layer so as to be connected to both the top and side surfaces of the second internal terminal electrode through the second opening.

In the present invention, it is preferable that the side surface of the first internal terminal electrode is positioned inside the first opening and the external terminal electrode is connected to the side surface of the first internal terminal electrode through the second and first openings. With this configuration, a depth of the opening is large and, thus, the contact area between the external terminal electrode and side surface of the internal terminal electrode can be increased to thereby further enhance the joint strength between the terminal electrodes.

In the present invention, it is preferable that the planar coil pattern is a spiral conductor and an outer peripheral end of the spiral conductor is connected to the first Internal electrode. With this configuration, the outer peripheral end of the spiral conductor and the external terminal electrode can reliably be connected to each other.

In the present invention, it is preferable that the planar coil pattern is a spiral conductor, the thin-film coil layer further includes a lead conductor formed in the second conductor layer and a through-hole conductor passing through the first insulating layer, one end of the lead conductor Is connected to the second internal terminal electrode, and the other end of the lead conductor is connected to an inner peripheral end of the spiral conductor through the through-hole conductor. With this configuration, the inner peripheral end of the spiral conductor and external terminal electrode can reliably be connected.

According to the present invention, it is possible to provide an electronic component capable of enhancing the joint strength between the first and second terminal electrodes connected to each other through the opening formed in the insulating layer and a manufacturing method thereof.

BRIEF DESCRIPTION OF THE DRAWINGS

The above features and advantages of the present invention will be more apparent from the following description of certain preferred embodiments taken in conjunction with the accompanying drawings, in which:

FIGS. 4A and 4B are schematic views each showing a connection relationship between the bump electrodes 12*a* to 12*d* and internal terminal electrodes 24*a* to 24*d*, wherein FIG. 4A is a schematic plan view, and FIG. 4B is a schematic cross-sectional view taken along A-A' line of FIG. 4A;

DETAILED DESCRIPTION OF THE EMBODIMENTS

Preferred embodiments of the present invention will be explained below in detail with reference to the accompanying drawings.

Figure 1:
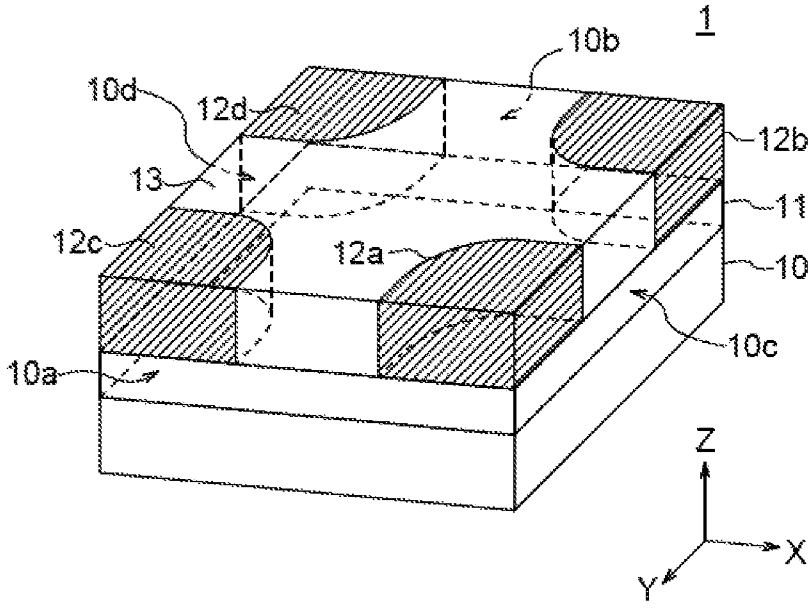
FIG. 1 is a schematic perspective view showing a structure of a coil component 1 that is an electronic component according to a first embodiment of the present invention.

FIG. 1 is a schematic perspective view showing a structure of a coil component 1 according to a first embodiment of the present invention.

As shown in FIG. 1, a coil component 1 according to the present embodiment is a common mode filter and includes a substrate 10, a thin-film coil layer 11 including a common mode filter element provided on one main (top) surface of the substrate 10, first to fourth bump electrodes 12*a* to 12*d* provided on one main (top) surface of the thin-film coil layer 11, and a magnetic resin layer 13 provided on the main surface of the thin-film coil layer 11 excluding formation positions of the bump electrodes 12*a* to 12*d.*

The coil component 1 is a surface mount chip component having a substantially rectangular parallelepiped shape. The coil component 1 has two side surfaces 10*a*, 10*b* extending in parallel to a longitudinal direction (X-direction) and two surfaces 10*c*, 10*d* extending perpendicular to the longitudinal direction. The first to fourth bump electrodes 12*a* to 12*d* are provided at corner portions of the coil component 1 so as to each have an exposed surface at an outer peripheral surface of the coil component 1. More specifically, the first bump electrode 12*a* has exposed surfaces at the side surfaces

10a and 10c, respectively, the second bump electrode 12b has exposed surfaces at the side surfaces 10b and 10c, respectively, the third bump electrode 12c has exposed surfaces at the side surfaces 10a and 10d, respectively, and the fourth bump electrode 12d has exposed surfaces at the side surfaces 10b and 10d, respectively. In a mounting state, the coil component 1 is turned upside down and used with the bump electrodes 12a to 12d facing down.

The substrate 10 ensures mechanical strength of the coil component 1 and serves as a closed magnetic path of the common mode filter. A magnetic ceramic material, for example, sintered ferrate can be used as a material of the substrate 10. Further, depending on required characteristics, a non-magnetic material may be used. Though not particularly limited, when a chip size is a "0605" type (0.6×0.5×0.5 (mm)), a thickness of the substrate 10 can be set to about 0.1 mm to 0.3 mm.

The thin-film coil layer 11 is a layer including a common mode filter element provided between the substrate 10 and magnetic resin layer 13. The thin-film coil layer 11 has, as will be described in detail later, a multi-layered structure formed by an insulating layer and a conductor pattern being alternately stacked. Thus, the coil component 1 according to the present embodiment is so-called a thin-film type coil component and is to be distinguished from a wire wound type having a structure in which a conductor wire is wound around a magnetic core.

The magnetic resin layer 13 is a layer constituting a mounting surface (bottom surface) of the coil component 1 and protects the thin-film coil layer 11 together with the substrate 10 and also serves as a closed magnetic path of the coil component 1. However, mechanical strength of the magnetic resin layer 13 is weaker than that of the substrate 10 and plays only a supplementary role in terms of strength. An epoxy resin (composite ferrite) containing ferrite powder can be used as the magnetic resin layer 13. Though not particularly limited, when the chip size is the "0605" type, a thickness of the magnetic resin layer 13 can be set to about 0.02 mm to 0.1 mm.

Figure 2:
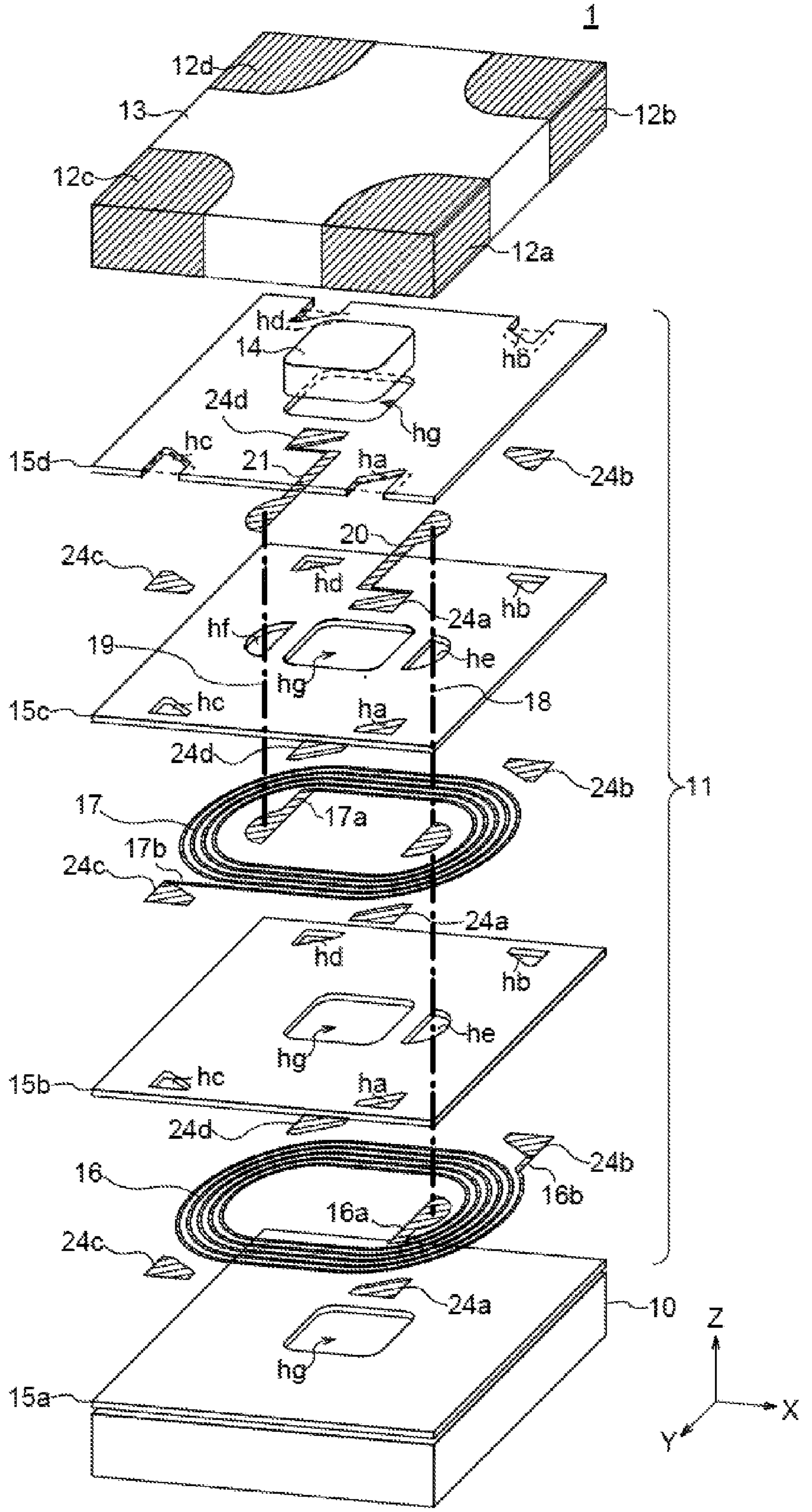
FIG. 2 is a schematic exploded perspective view showing a layer structure of the coil component 1 in detail.
Figure 3:
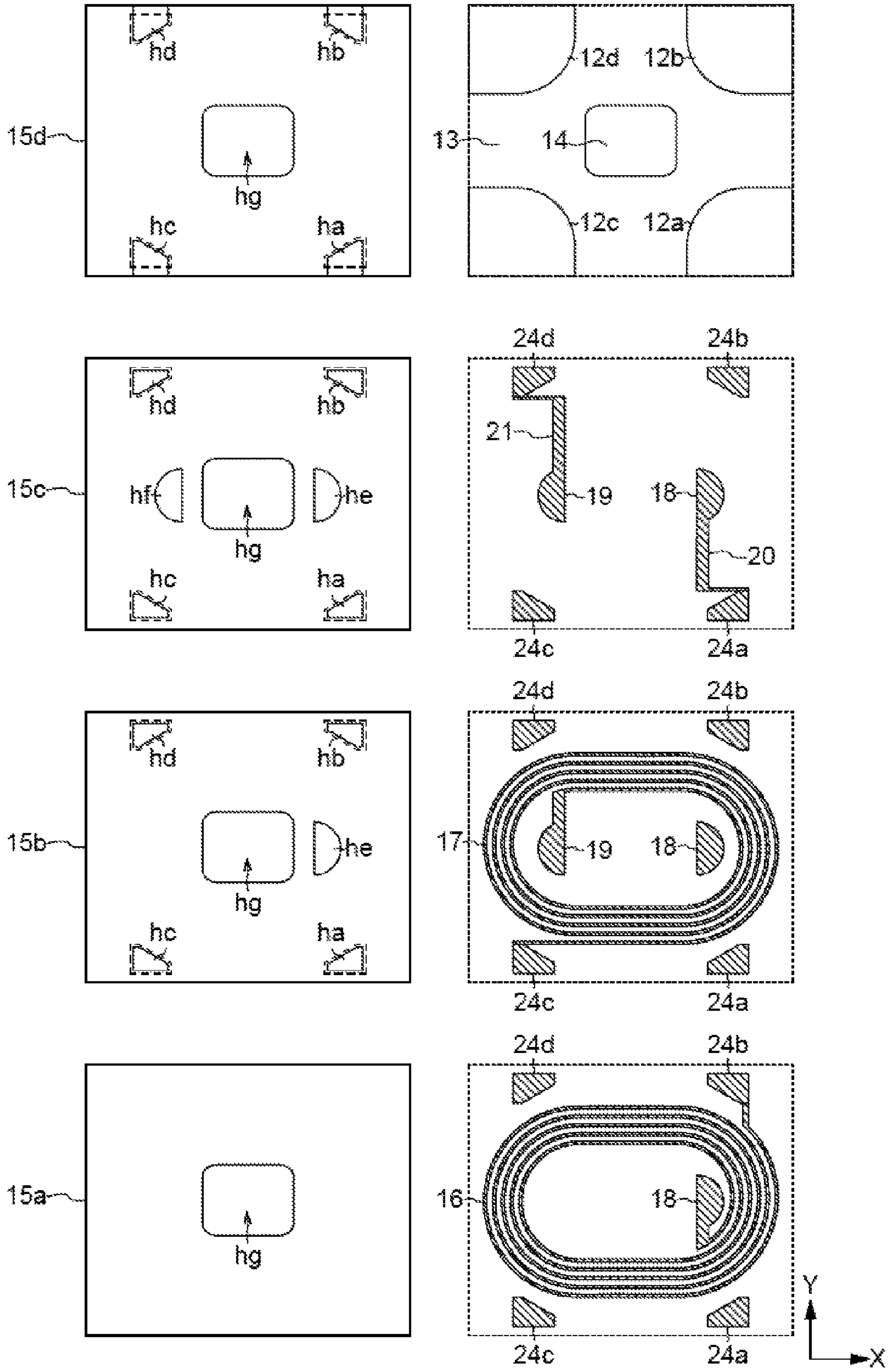
FIG. 3 is a plan view showing each resolved layer.

FIG. 2 is a schematic exploded perspective view showing a layer structure of the coil component 1 in detail. Further, FIG. 3 is a plan view showing each resolved layer.

As shown in FIG. 2, the thin-film coil layer 11 includes first to fourth insulating layers 15a to 15d, and first to third conductor layers. The first to fourth insulating layers 15a to 15d are sequentially stacked from the substrate 10 side toward the magnetic resin layer 13 side. The first conductor layer includes a first spiral conductor 16 as a planar coil pattern formed on the first insulating layer 15a and internal terminal electrodes 24a to 24d. The second conductor layer includes a second spiral conductor 17 as a planar coil pattern formed on the second insulating layer 15b and the internal terminal electrodes 24a to 24d. The third conductor layer includes first and second lead conductors 20 and 21 formed on the third insulating layer 15c and internal terminal electrodes 24a to 24d. Bump electrodes 12a to 12d are provided on the fourth insulating layer 15d. A conductor pattern such as the internal terminal electrode is not formed on the fourth insulating layer 15d.

The first to fourth insulating layers 15a to 15d insulate the conductor patterns provided in different layers and also serve to secure flatness of the plane on which the conductor patterns are formed. Particularly, the first insulating layer 15a serves to increase accuracy of finishing the spiral conductor patterns by absorbing unevenness of the surface of the substrate 10. It is preferable to use a resin excellent in electric and magnetic insulation properties and easy in micro fabrication as a material of the insulating layers 15a to 15d and though not particularly limited, a polyimide resin or epoxy resin can be used.

An internal peripheral end 16a of the first spiral conductor 16 is connected to the first bump electrode 12a through a first contact hole conductor 18 passing through the second and third insulating layers 15b, 15c, first lead conductor 20, and first internal terminal electrode 24a. An external peripheral end 16b of the first spiral conductor 16 is connected to the second bump electrode 12b through the second internal terminal electrode 24b.

an internal peripheral end 17a of the second spiral conductor 17 is connected to the fourth bump electrode 12d through a second contact hole conductor 19 passing through the third insulating layer 15c, second lead conductor 21, and fourth internal terminal electrode 24d. An external peripheral end 17b of the second spiral conductor 17 is connected to the third bump electrode 12c through the third internal terminal electrode 24c.

The first and the second spiral conductors 16 and 17 have substantially the same plane shape and are provided in the same position in a plan view. The first and the second spiral conductors 16 and 17 overlap each other and thus, strong magnetic coupling is generated between both conductors. The first spiral conductor 16 is wound counterclockwise from the inner peripheral end 16a toward outer peripheral end 16b, and the second spiral conductor 17 is wound counterclockwise from the outer peripheral end 17b toward inner peripheral end 17a, so that a direction of a magnetic flux generated by current flowing from the first bump electrode 12a toward the second bump electrode 12b and a direction of a magnetic flux generated by current flowing from the third bump electrode 12c toward the fourth bump electrode 12d become the same, enhancing the entire magnetic flux. With the above configuration, the conductor patterns in the thin-film coil layer 11 constitute a common mode filter.

The first and the second spiral conductors 16 and 17 have both a circular spiral outer shape. A circular spiral conductor attenuates less at high frequencies and thus can be used preferably as a high-frequency inductance. The spiral conductors 16 and 17 according to the present embodiment have an oblong shape, but may also have a complete round shape or elliptic shape. Alternatively, the spiral conductors 16 and 17 may have a substantially rectangular shape.

An opening hg passing through the first to fourth insulating layers 15a to 15d is provided in a central region of each of the first to fourth insulating layers 15a to 15d and on an inner side of each of the first and second spiral conductors 16 and 17, and a through-hole magnetic body 14 for forming a magnetic path is formed inside the opening hg. It is preferable to use the same material as that of the magnetic resin layer 13 as a material of the through-hole magnetic body 14.

The first and second lead conductors 20 and 21 are formed on the third insulating layer 15c. One end of the first lead conductor 20 is connected to an upper end of the contact hole conductor 18, and the other end thereof is connected to the internal terminal electrode 24a. Further, one end of the second lead conductor 21 is connected to an upper end of the contact hole conductor 19, and the other end thereof is connected to the internal terminal electrode 24d.

The first to fourth bump electrodes 12a to 12d are provided on the fourth insulating layer 15d constituting a surface layer of the thin-film coil layer 11. The first to fourth bump electrodes 12a to 12d are external terminal electrodes and are connected to the internal terminal electrodes 24*a* to 24*d*, respectively. The "bump electrode" herein means not an electrode formed by thermally compressing a metal ball of Cu, Au or the like using a flip chip bonder but a thick-film plated electrode formed by plating. A thickness of the bump electrode is equal to or more than the thickness of the magnetic resin layer 13 and can be set to about 0.02 mm to 0.1 mm. That is, the thickness of each of the bump electrodes 12*a* to 12*d* is larger than a conductor pattern in the thin-film coil layer 11 and particularly has a thickness five times or more than the spiral conductor pattern in the thin-film coil layer 11.

The first to fourth to imp electrodes 12*a* to 12*d* have substantially the same plane shape. According to the configuration, the bump electrode pattern in the bottom surface of the coil component 1 has symmetric property and thus, a terminal electrode pattern that is free from constrained mounting orientation and good-looking can toe provided.

The magnetic resin layer 13 is formed, together with the first to fourth bump electrodes 12*a* to 12*d*, on the fourth insulating layer 15*d*. The magnetic resin layer 13 is provided so as to fill peripheries of the bump electrodes 12*a* to 12*d*. A side surface of each of the bump electrodes 12*a* to 12*d* contacting the magnetic resin layer 13 preferably has a curved shape without edges (corners). The magnetic resin layer 13 is formed toy pouring a paste of composite ferrite after the bump electrodes 12*a* to 12*d* are formed, and if, at this point, the side surface of each of the bump electrodes 12*a* to 12*d* has an edge portion, surroundings of the bump electrodes are not completely packed with the paste and bubbles are more likely to be contained. However, if the side faces of the bump electrodes 12*a* to 12*d* are curved, fluid resin reaches every corner so that a closely packed magnetic resin layer 13 containing no bubbles can be formed. Moreover, adhesiveness between the magnetic resin layer 13 and the bump electrodes 12*a* to 12*d* is increased so that reinforcement for the bump electrodes 12*a* to 12*d* can be increased.

The second insulating layer 15*b* has, formed therein, openings ha to hd corresponding respectively to the first to fourth internal terminal electrodes 24*a* to 24*d* and an opening he corresponding to the first contact hole conductor 18. The openings ha to he are provided for ensuring electrical connection between the upper and lower conductor layers. The internal terminal electrodes 24*a* to 24*d* formed on the second insulating layer 15*b* are partly embedded in the openings ha to hd of the second insulating layer 15*b* provided just therebelow (see FIG. 4B) to be electrically connected to the internal terminal electrodes 24*a* to 24*d* formed on the first insulating layer 15*a*. Note that the openings ha to hd corresponding to the internal terminal electrodes are not formed in the first insulating layer 15*a*.

The third insulating layer 15*c* has, formed therein, an opening hf corresponding to the second contact hole conductor 19, in addition to the openings ha to he. The internal terminal electrodes 24*a* to 24*d* formed on the third insulating layer 15*c* are partly embedded in the openings ha to hd of the third insulating layer 15*c* provided just therebelow (see FIG. 4B) to be electrically connected to the internal terminal electrodes 24*a* to 24*d* formed on the second insulating layer 15*b*.

The fourth insulating layer 15*d* has, formed therein, the openings ha to hd but does not have the openings he and hf corresponding respectively to the first and second contact hole conductors 18 and 19. The bump electrodes 12*a* to 12*d* are partly embedded in the openings ha to hd of the fourth insulating layer 15*d*, so that top surfaces of the internal terminal electrodes 24*a* to 24*d* on the third insulating layer 15*c* are connected to their corresponding bump electrodes 12*a* to 12*d* through the openings ha to hd formed in the fourth insulating layer 15*d*.

A size of each of the openings ha to hd formed in each of the second and third insulating layers 15*b* and 15*c* is slightly smaller than a size of each of the internal terminal electrodes 24*a* to 24*d* formed just therebelow. In FIG. 3, a dashed line running around each of the openings ha to hd formed in each of the insulating layers 15*b* to 15*d* indicates a size (surface of projection) of each of the corresponding internal terminal electrodes 24*a* to 24*d*. As shown in FIG. 3, only a top surface of each of the internal terminal electrodes 24*a* to 24*d* is exposed through each of the openings ha to hd. On the other hand, each of the openings ha to hd formed in the fourth insulating layer 15*d* has an extended portion running outward over a periphery (profile) of each of the internal terminal electrodes 24*a* to 24*d* formed just therebelow. Thus, through each of the openings ha to hd, not only the top surface of each of the internal terminal electrodes 24*a* to 24*d*, but also a side surface of each of the internal terminal electrodes 24*a* to 24*d* is exposed.

Figure 4A:
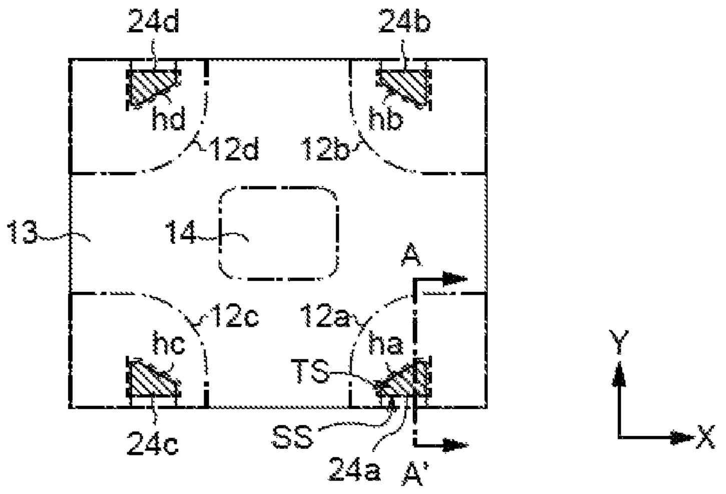
Figure 4B:
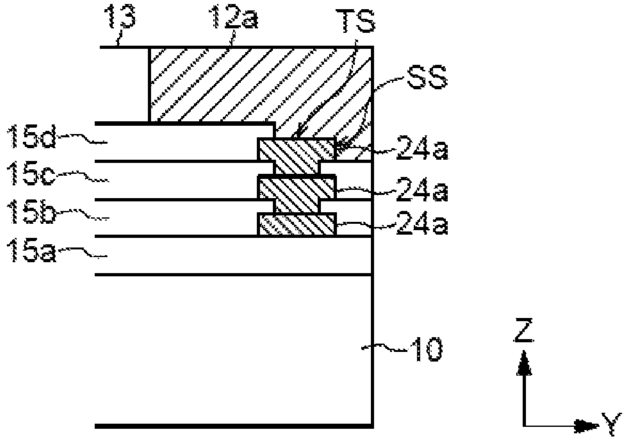

FIGS. 4A and 4B are schematic views each showing a connection relationship between the bump electrodes 12*a* to 12*d* and internal terminal electrodes 24*a* to 24*d*. FIG. 4A is a schematic plan view, and FIG. 4B is a schematic cross-sectional view taken along A-A' line of FIG. 4A.

As shown in FIG. 4A, the internal terminal electrodes 24*a* to 24*d* are exposed through the openings ha to hd formed in the fourth insulating layer 15*d*, and the bump electrodes 12*a* to 12*d*, each indicated by a long dashed dotted line, cover the corresponding internal terminal electrodes 24*a* to 24*d*.like FIG. 3, a dashed line indicates an actual size of each of the internal terminal electrodes 24*a* to 24*d*. Further, a hatched region indicates each of the internal terminal electrodes 24*a* to 24*d* exposed through the openings ha to hd. For example, as shown in FIG. 4A, the opening ha extends outward (direction from A to A') from an inner side in a Y-direction toward to reach the edge, that is, runs over the periphery of the internal terminal electrode 24*a*. Note that such a cut shape is regarded as "opening".

Thus, as shown in FIG. 4B, not only a top surface TS of the internal terminal electrode 24*a*, but also a side surface SS thereof parallel to the X-direction is exposed through the opening ha. That is, a bottom surface of the opening ha formed in the fourth insulating layer 15*d* has a level difference. The openings ha to hd formed in each of the second and third insulating layers 15*b* and 15*c* are small openings through which only the top surfaces of the internal terminal electrodes 24*a* to 24*d* are exposed.

When the bump electrode 12*a* is formed above the opening ha thus formed, the bump electrode 12*a* is partly embedded in the opening ha and is thus brought into contact with both the top surface TS and side surface SS of the internal terminal electrode 24*a*, whereby the joint strength between the bump electrode 12*a* and internal terminal electrode 24*a* can be enhanced. The same can be said for the internal terminal electrodes 24*b* to 24*d*.

The bump electrodes 12*a* to 12*d* are each much larger in size than each of the internal terminal electrodes 24*a* to 24*d*, so that peeling is likely to occur between each of the bump electrodes 12*a* to 12*d* and each of corresponding internal terminal electrodes 24*a* to 24*d* due to thermal expansion and the like. However, in the coil component 1 of the present embodiment, both the top surface TS and side surface SS of each of the internal terminal electrodes 24*a* to 24*d* are positioned within each of the openings ha to hd of the insulating layer 15*d*, and each of the bump electrodes 12*a* to 12*d* is brought into contact with both the top and side surfaces of each of the internal terminal electrodes 24*a* to 24*d* in the inside of the corresponding opening, so that the joint strength between the bump electrode and comparatively small-size internal terminal electrode can be enhanced to increase connection reliability.

Next, a method of manufacturing the coil component 1 will be described in detail. In the present embodiment, a mass-production process is performed for the manufacture of the coil component 1 in which a large number of common mode filter elements (coil conductor patterns) are formed on a large magnetic substrate (magnetic wafer) and then each element is individually cut to manufacture a large number of chip components.

Figure 5:
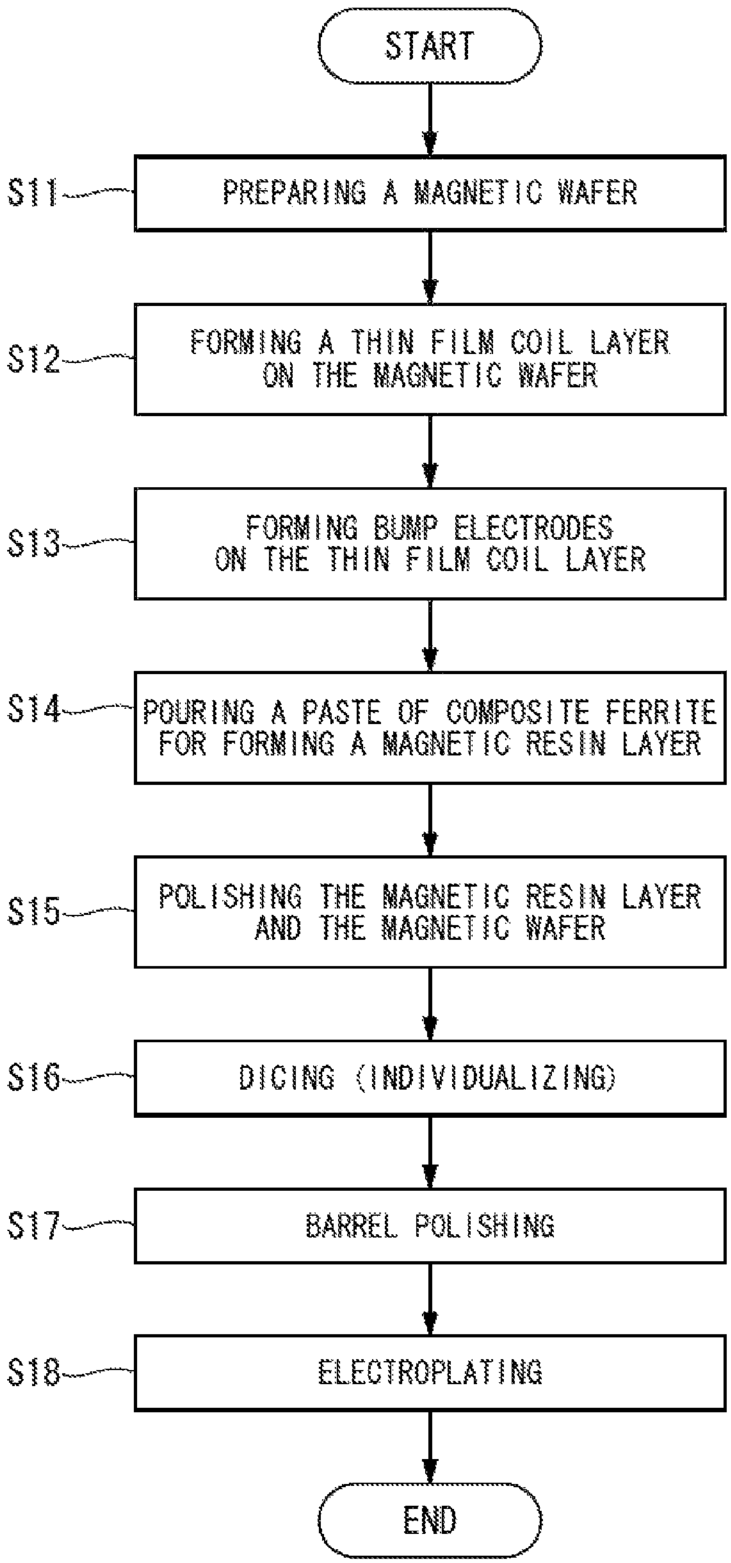
FIG. 5 is a flow chart showing a manufacturing method of the coil component 1.
Figure 6:
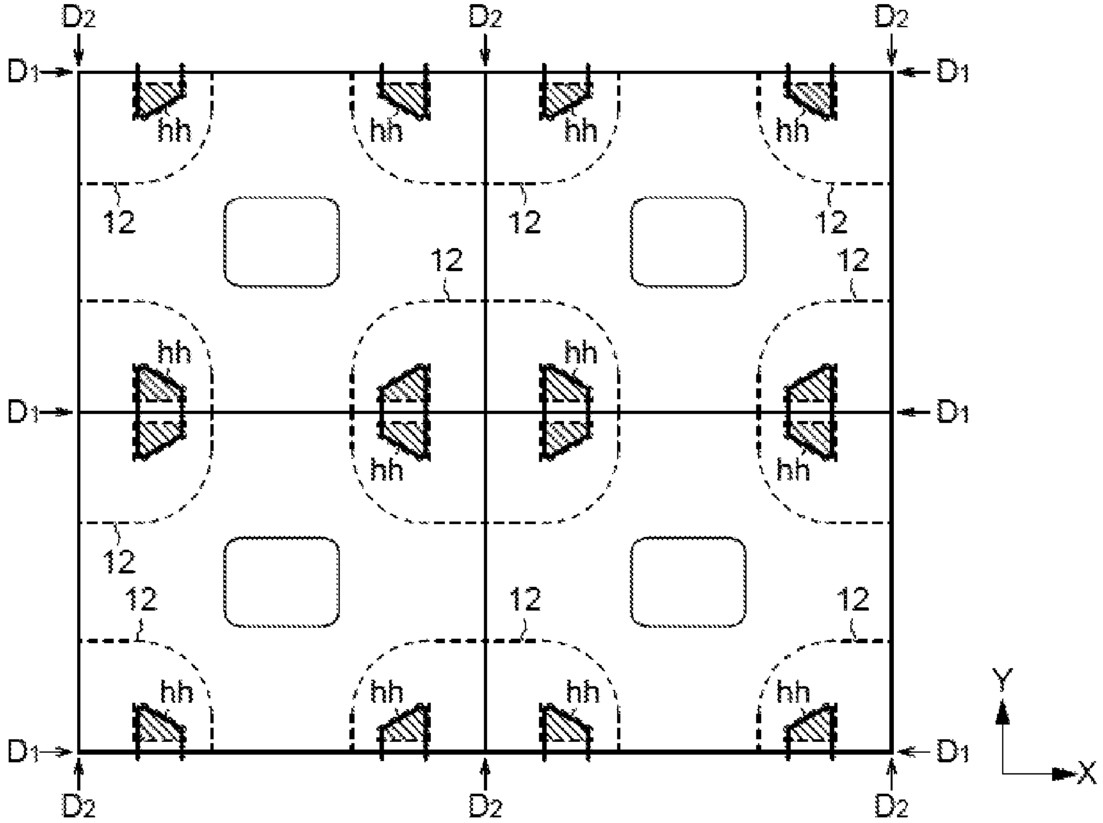
FIG. 6 is a schematic plan view showing a configuration of a magnetic wafer on which a large number of the coil components 1 are formed.

FIG. 5 is a flow chart showing a manufacturing method of the coil component 1. FIG. 6 is a schematic plan view showing a configuration of a magnetic wafer on which a large number of the coil components 1 are formed.

First a magnetic wafer is prepared (step S11) and the thin-film coil layer 11 on which a large number of common mode filter elements are laid out on the surface of the magnetic wafer is formed (step S12).

The thin-film coil layer 11 is formed by repeating a formation process of a conductor pattern on the surface of the previously formed insulating layer. The formation process of the thin-film coil layer 11 will be described in detail below.

In the formation of the thin-film coil layer 11, the insulating layer 15*a* is first formed and then, the first spiral conductor 16 and the internal terminal electrodes 24*a* to 24*d* are formed on the insulating layer 15*a*. Next, after the insulating layer 15*b* is formed on the insulating layer 15*a*, the second spiral conductor 17 and the internal terminal electrodes 24*a* to 24*d* are formed on the insulating layer 15*b*. Then, after the insulating layer 15*c* is formed on the insulating layer 15*b*, the first and second lead conductors 20, 21 and internal terminal electrodes 24*a* to 24*d* are formed on the insulating layer 15*c* and further, the insulating layer 15*d* is formed on the insulating layer 15*c* (see FIG. 2).

Each of the insulating layers 15*a* to 15*d* can be formed by spin-coating the substrate surface with a photosensitive resin or bonding a photosensitive resin film to the substrate surface and exposing and developing the resultant substrate surface. The opening hg is formed in the first insulating layer 15*a*, the openings ha to he and opening hg are formed in the second insulating layer 15*b*, the openings ha to hg are formed in the third insulating layer 15*c*, and the openings ha to hd and opening hg are formed in the fourth insulating layer 15*d*. As shown in FIG. 6, each of the openings ha to hd formed in the fourth insulating layer 15*d* is formed as an opening hh common to two elements adjacent to each other in the Y-direction.

It is preferably to use Cu as a material of conductor patterns, which can be formed by forming a base conductor layer by the vapor deposition or sputtering and then forming a patterned resist layer thereon and performing electroplating so as to remove the resist layer and unnecessary base conductor layer. When there is a need to increase an aspect ratio of each of the spiral conductors 16 and 17 in order to reduce DC resistance, electroplating is performed with high current density after the removal of the resist layer and unnecessary base conductor layer.

At this point, the openings (through holes) he and hf for forming the contact hole conductors 18 and 19 are each filled with a plating material, whereby the contact hole conductors 18 and 19 are formed. Further, the openings ha to hd for forming the internal terminal electrodes 24*a* to 24*d* are each also filled with the plating material, whereby the internal terminal electrodes 24*a* to 24*d* are formed.

Next, the bump electrode 12, which is an aggregation of the bump electrodes 12*a* to 12*d*, is formed on the insulating layer 15*d* as the surface layer of the thin-film coil layer 11 (step S13). As the formation method of the bump electrode 12, a base conductor layer is first formed on the entire surface of the insulting layer 15*d* by sputtering. Cu or the like can be used as a material of the base conductor layer. Then, a dry film, is pasted and then the dry film in positions where the bump electrodes 12*a* to 12*d* and the first and second lead conductors 20 and 21 should be formed is selectively removed by exposure and development to form a dry film layer and to expose the base conductor layer. Note that the formation method of the bump electrode is not limited to that using the dry film.

Next, the electroplating is further performed and exposed portions of the base conductor layer are grown to form an aggregation of the thick bump electrodes 12*a* to 12*d*. At this point, the openings ha to hg formed in the insulating layer 15*d* are each filled with a plating material, whereby the bump electrodes 12*a* to 12*d* and internal terminal electrodes 24*a* to 24*d* are electrically connected, respectively.

Then, the dry film layer is removed and the unnecessary base conductor layer is removed by etching the entire surface to complete the bump electrode 12 having substantially a columnar shape. At this time, as shown in FIG. 6, the bump electrode 12 with a substantially columnar shape is formed as an electrode common to four chip components adjacent to each other in the X- and Y-directions. The bump electrode 12 is divided into four by dicing to be described later, whereby the individual bump electrodes 12*a* to 12*d* corresponding to each element are formed.

Next, a paste of composite ferrite is poured onto the magnetic wafer on which the bump electrode 12 is formed and cured to form the magnetic resin layer 13 (step S14). Further, at the same time, the paste of composite ferrite is poured also into the opening hg to form the through-hole magnetic body 14. At this time, a large amount of paste is poured to reliably form the magnetic resin layer 13, thereby the bump electrode 12 is embedded in the magnetic resin layer 13. Thus, the magnetic resin layer 13 is polished until the top surface of the bump electrode 12 is exposed to have a predetermined thickness and also to make the surface thereof smooth (step S15). Further, the magnetic wafer Is also polished to have a predetermined thickness (step S15).

Thereafter, each common mode filter element is individualized (formed into a chip) by dicing of the magnetic wafer (step S16). In this case, as shown in FIG. 6, a cutting line D1 extending in the X-direction and a cutting line D2 extending in the Y-direction pass through a center of the bump electrode 12 and the obtained cut surface of each of the bump electrodes 12*a* to 12*d* is exposed to the side surface of the coil component 1. The side surfaces of each of the bump electrodes 12*a* to 12*d* become a formation surface of a solder fillet during mounting and thus, fixing strength during soldering can be increased. Note that there may be adopted a mounting configuration (LGA, etc.) wherein the side surface is not used. That is, the bump shape may be varied according to the mounting configuration.

Next, after edges are removed toy performing barrel polishing of chip components (step S17), electroplating is performed (step S18), thereby completing the bump electrodes 12*a* to 12*d* shown in FIG. 1. By performing barrel polishing of the Outer surface of chip components as described above, coil components resistant to damage such as chipping can be manufactured. The surface of each of the bump electrodes 12*a* to 12*d* exposed on an outer circumferential surface of chip components is plated and thus, the surface of each of the bump electrodes 12*a* to 12*d* can be made a smooth surface.

According to the manufacturing method of the coil component 1 in the present embodiment, as described above, it is possible to manufacture, with ease and at low cost, a small electronic component capable of enhancing the joint strength between first and second terminal electrodes connected to each other through the openings formed in the insulating layers. Further, the magnetic resin layer 13 is formed so as to fill peripheries of the bump electrodes 12*a* to 12*d* serving as external electrodes and therefore, the bump electrodes 12*a* to 12*d* can be reinforced to prevent peeling of the bump electrodes 12*a* to 12*d* or the like. Also, according to the manufacturing method of the coil component 1 in the present embodiment, the bump electrodes 12*a* to 12*d* are formed by plating and therefore, compared with formation by, for example, sputtering, an external terminal electrode whose accuracy of finishing is higher and which is more stable can be provided. Further, reduction in cost and man-hours can be achieved.

FIGS. 7A to 7D are schematic plan views each showing a modification of a shape of the openings ha to hd formed in the insulating layer 15*d*.

Figure 7A:
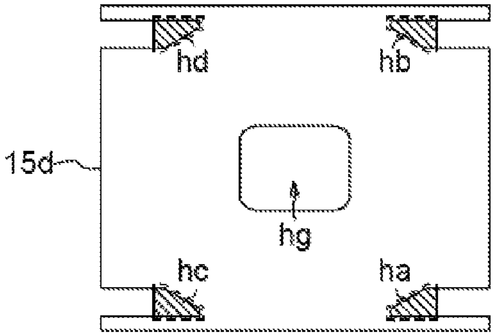
FIGS. 7A to 7D are schematic plan views each showing a modification of a shape of the openings ha to hd formed in the insulating layer 15*d;*

The openings ha to hd of the insulating layer 15*d* shown in FIG. 7A each have a structure in which the extended portion of the opening is formed not in the Y-direction, but in the X-direction. Thus, a side surface of the internal terminal electrode parallel to the Y-direction is exposed in each of the openings ha to hd. According to this structure, as in the case of the openings ha to hd shown in FIG. 4, the joint strength between the bump electrodes 12*a* to 12*d* and internal terminal electrodes 24*a* to 24*d* can be enhanced.

Figure 7B:
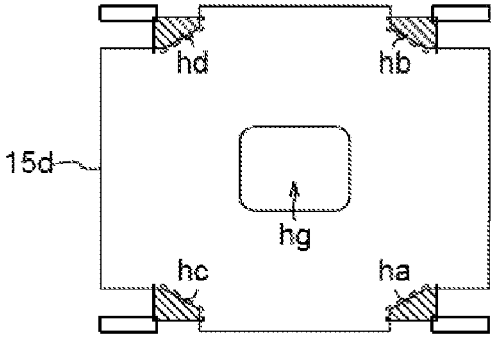
Figure 7C:
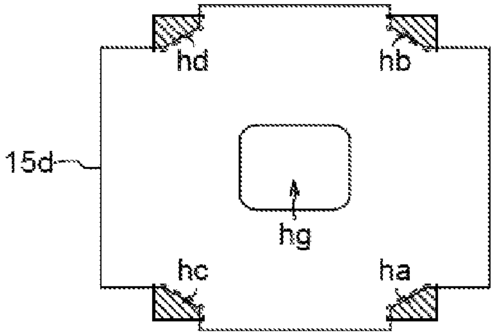

In the example of FIG. 7B, the extended portion of the opening is formed in both the X- and Y-directions. That is, the opening pattern of FIG. 7B is obtained by simply combining the opening pattern of FIG. 4A and that of FIG. 7A. Thus, side surfaces of the internal terminal electrode parallel to both the X- and Y-directions are exposed in each of the openings. In the example of FIG. 7C, a large opening is formed over the entire corner portion including the extended portion of the FIG. 7B. Thus, side surfaces of the internal terminal electrode parallel to both the X- and Y-directions are exposed in each of the openings. According to these structures, the joint strength between the bump electrodes 12*a* to 12*d* and internal terminal electrodes 24*a* to 24*d* can further be enhanced.

Figure 7D:
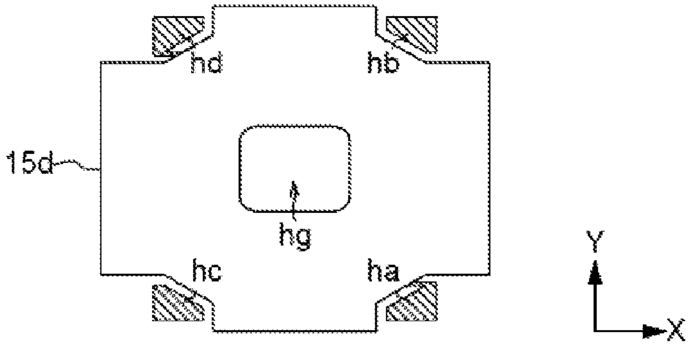

In the example of FIG. 7D, the extend portion formed in both X- and Y-directions are further extended than in the structure of FIG. 7C. In the example of FIG. 7C, the extended portion is extended only toward the outside (toward the outer peripheral side) of the insulating layer; while in the example of FIG. 7D, the extended portion is extended toward both the inside and outside of the insulating layer. In this structure, all the side surfaces of the internal terminal electrode are exposed, thereby further enhancing the joint strength between the bump electrodes and internal terminal electrodes.

Figure 8:
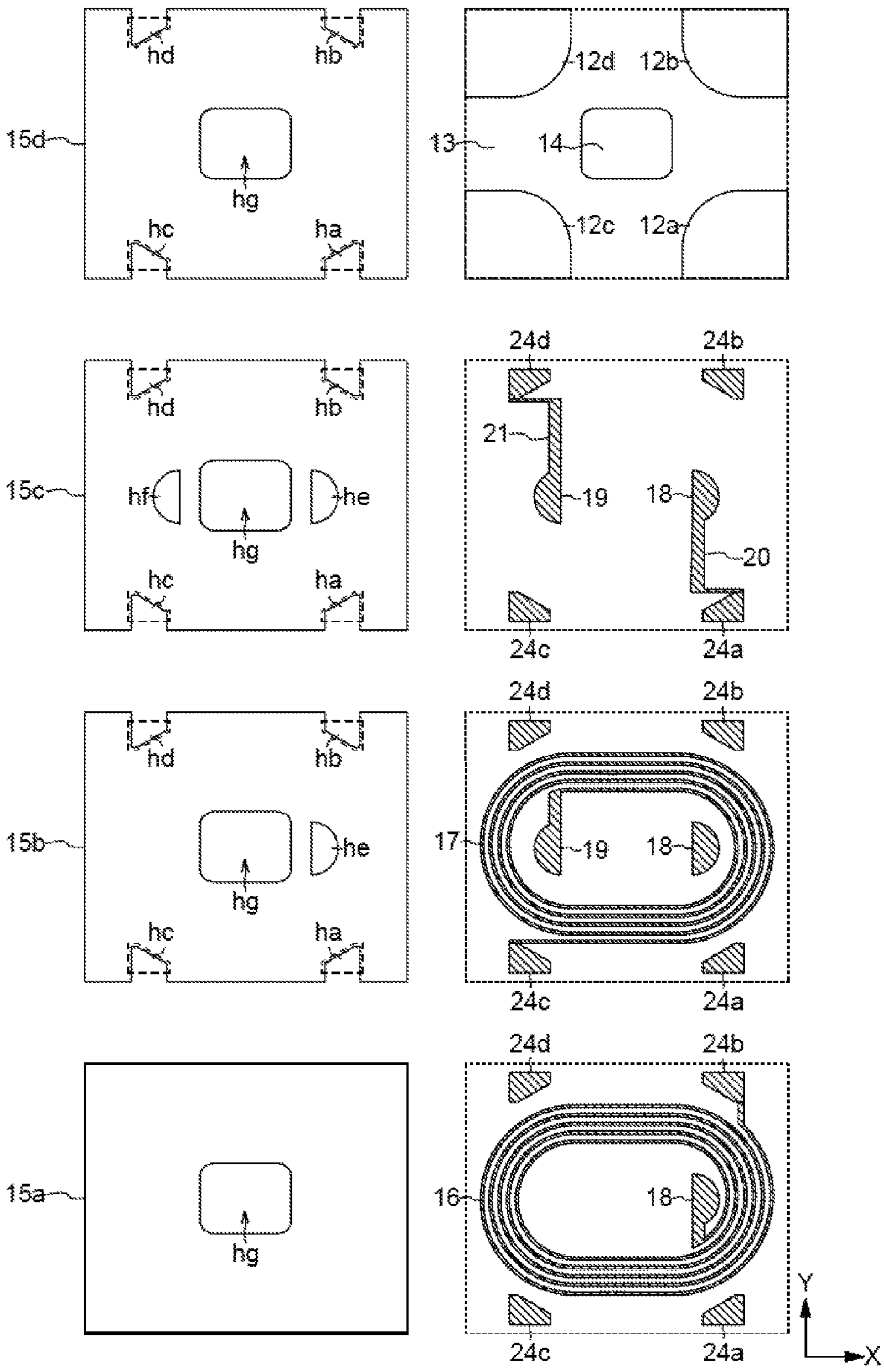
FIG. 8 is an exploded plan view showing a layer structure of a coil component according to a second embodiment of the present invention.
Figure 9:
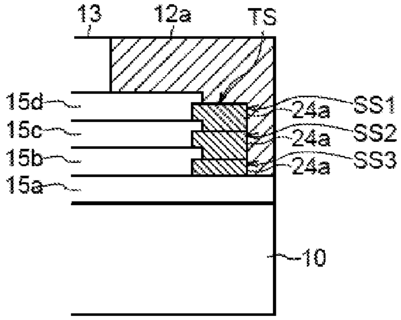
FIG. 9 is a schematic cross-sectional view partly showing a structure of the coil component 2 according to the second embodiment, which corresponds to FIG. 4B which is a cross-sectional view taken along the A-A' line of FIG. 4A.

FIG. 8 is an exploded plan view showing a layer structure of a coil component according to a second embodiment of the present invention. FIG. 9 is a schematic cross-sectional view partly showing a structure of the coil component 2 according to the second embodiment, which corresponds to FIG. 4B which is a cross-sectional view taken along the A-A' line of FIG. 4A.

As shown in FIG. 8, the coil component 2 according to the present embodiment is characterized in that large openings ha to hd are formed not only in the fourth Insulating layer 15*d*, but also in the second and third insulating layers 15*b* and 15*c*.

As shown in FIG. 9, the bump electrode 12*a* is embedded deeply In the opening ha formed in each of the insulating layers 15*b* to 15*d* successively in the stacking direction and brought into contact not only with the top surface TS and a side surface SS1 of the internal terminal electrode 24*a* formed on the insulating layer 15*c*, but also with a side surface SS2 of the Internal terminal electrode 24*a* formed on the insulating layer 15*b* and a side surface SS3 of the internal terminal electrode 24*a* formed on the insulating layer 15*a*, so that the joint strength between the bump electrode 12*a* and internal terminal electrode 24*a* can further be enhanced.

It is apparent that the present invention is not limited to the above embodiments, but may be modified and changed without departing from the scope and spirit of the invention.

For example, although the magnetic resin layer is used to fill peripheries of the bump electrode in the above embodiment, a simple insulating layer having no magnetic property may be used in the present invention. In addition, the through-hole magnetic body 14 may be omitted.

Further, although the bump electrodes 12*a* to 12*d* are used as the external terminal electrodes to be connected to the internal terminal electrodes in the above embodiment, an external terminal electrode having different shape or structure as the bump electrode may be used in the present invention. Further, the present invention may be applied not only to connection between the internal terminal electrode and external terminal electrode, but also to connection between the internal terminal electrodes. Further, the shape of the coil conductor is not limited to a spiral pattern, but may be various planar coil patterns.

Further, although the thin-film coil layer 11 of a three-conductor layer structure including the insulating layers 15*a* to 15*d* is used in the above embodiment, the number of the insulating layers to be laminated is not limited in the present invention, and the structure of the thin-film coil layer 11 is not limited to the three-conductor layer structure. Further, although the common mode filter is exemplified as the coil component in the present embodiment, the present invention may be applied not only to the common mode filter, but also to various types of coil components and further to various electronic components other than the coil component.

What is claimed is:

1. An electronic component comprising:

a conductor layer including a first terminal electrode;

an insulating layer covering at least a top surface of the conductor layer and having an opening, the opening having an extended portion running outward over a periphery of the first terminal electrode in a plan view and both at least a part of a top surface and at least a part of an outer peripheral side surface of the first terminal electrode being positioned inside the opening; and a second terminal electrode formed on at least a top surface of the insulating layer and embedded in the opening so as to be connected to both the part of the top surface and the part of the outer peripheral side surface of the first terminal electrode through the opening.

2. The electronic component as claimed in claim 1, further comprising:

a substrate; and a thin-film coil layer formed on the substrate and having the conductor layer and the insulating layer, wherein the conductor layer further includes a planar coil pattern connected to the first terminal electrode, the first terminal electrode is an internal terminal electrode of the thin-film coil layer, and the second terminal electrode is an external terminal electrode formed on a surface of the thin-film coil layer.

3. The electronic component as claimed in claim 2, wherein the internal terminal electrode has at least a first outer peripheral side surface parallel to a longitudinal direction of the substrate and at least a second outer peripheral side surface parallel to a direction perpendicular to the longitudinal direction, and at least one of the first and second outer peripheral side surfaces is positioned inside the opening.

4. The electronic component as claimed in claim 3, wherein both the first and second outer peripheral side surfaces are positioned inside the opening.

5. The electronic component as claimed in claim 2, wherein the thin-film coil layer has a multi-layered structure in which a plurality of the conductor layers and a plurality of the insulating layers are alternately stacked, the opening is formed in an uppermost one of the insulating layers, and both the top and outer peripheral side surfaces of the first terminal electrode formed in an uppermost one of the conductor layers are positioned inside the opening.

6. The electronic component as claimed in claim 2, wherein the thin-film coil layer has a multi-layered structure in which a plurality of the conductor layers and a plurality of the insulating layers are alternately stacked, the opening is formed in each of the insulating layers, and both the top and outer peripheral side surfaces of the first terminal electrode formed in each of the conductor layers are positioned inside the opening.

7. A manufacturing method of an electronic component comprising:

forming a conductor layer including a first terminal electrode;

forming an insulating layer covering the first terminal electrode;

forming an opening in the insulating layer so that the opening has an extended portion running outward over a periphery of the first terminal electrode in a plan view and both at least a part of a top surface and at least a part of an outer peripheral side surface of the first terminal electrode are exposed through the opening; and forming a second terminal electrode on the insulating layer and embedded in the opening so that the second terminal electrode is in contact with both the part of the top surface and the part of the outer peripheral side surface of the first terminal electrode through the opening.

8. The manufacturing method of the electronic component as claimed in claim 7, further comprising:

forming a thin-film coil layer including a planar coil pattern on a substrate; and forming an external terminal electrode on the thin-film coil layer, wherein the forming the thin-film coil layer includes the forming the conductor layer, the insulating layer and the opening, the first terminal electrode is an internal terminal electrode of the planar coil pattern, and the second terminal electrode is the external terminal electrode.

9. An electronic component comprising:

a substrate;

a thin-film coil layer formed on the substrate; and an external terminal electrode formed on a top surface of the thin-film coil layer, wherein the thin-film coil layer includes:

a first conductor layer including a planar coil pattern and a first internal terminal electrode;

a first insulating layer covering the first conductor layer and having a first opening, at least a top surface of the first internal terminal electrode being positioned inside the first opening;

a second conductor layer including a second internal terminal electrode formed on the first insulating layer so that the second internal terminal electrode is connected to the top surface of the first internal terminal electrode through the first opening; and a second insulating layer covering the second conductor layer and having a second opening, the second opening having an extended portion running outward over a periphery of the second internal electrode in a plan view and both at least part of a top surface and at least a part of an outer peripheral side surface of the second internal terminal electrode being positioned inside the second opening, and the external terminal electrode is formed on the second insulating layer and embedded in the second opening so as to be connected to both the part of the top surface and the part of the outer peripheral side surface of the second internal terminal electrode through the second opening.

10. The electronic component as claimed in claim 9, wherein an outer peripheral side surface of the first internal terminal electrode is positioned inside the first opening and the external terminal electrode is connected to the outer peripheral side surface of the first internal terminal electrode through the second and first openings.

11. The electronic component as claimed in claim 9, wherein the planar coil pattern is a spiral conductor and an outer peripheral end of the spiral conductor is connected to the first internal electrode.

12. The electronic component as claimed in claim 9, wherein the planar coil pattern is a spiral conductor, the thin-film coil layer further includes a lead conductor formed in the second conductor layer and a through-hole conductor passing through the first insulating layer, one end of the lead conductor is connected to the second internal terminal electrode, and the other end of the lead conductor is connected to an inner peripheral end of the spiral conductor through the through-hole conductor.

* * * * *